US012490591B2

(12) United States Patent
Sung et al.

(10) Patent No.: US 12,490,591 B2
(45) Date of Patent: Dec. 2, 2025

(54) DISPLAY DEVICE

(71) Applicant: Samsung Display Co., Ltd., Yongin-Si (KR)

(72) Inventors: Woo Yong Sung, Seoul (KR); Seungyong Song, Suwon-si (KR); Ung-Soo Lee, Seoul (KR); Seung-Yeon Chae, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 47 days.

(21) Appl. No.: 17/371,016

(22) Filed: Jul. 8, 2021

(65) Prior Publication Data

US 2022/0165982 A1  May 26, 2022

(30) Foreign Application Priority Data

Nov. 25, 2020  (KR) .......................... 10-2020-0160387

(51) Int. Cl.
*H10K 59/122*     (2023.01)
*H10K 59/121*     (2023.01)
*H10K 59/65*      (2023.01)
*H10K 59/80*      (2023.01)

(52) U.S. Cl.
CPC ......... *H10K 59/122* (2023.02); *H10K 59/121* (2023.02); *H10K 59/873* (2023.02); *H10K 59/65* (2023.02); *H10K 59/80* (2023.02); *H10K 59/8731* (2023.02)

(58) Field of Classification Search
CPC ...... H10K 77/10; H10K 59/65; H10K 59/121; H10K 59/122; H10K 59/124; H10K 50/80; H10K 50/844
See application file for complete search history.

(56) References Cited

U.S. PATENT DOCUMENTS

| | | | |
|---|---|---|---|
| 8,947,627 B2 | 2/2015 | Rappoport et al. | |
| 10,102,789 B2 | 10/2018 | Evans, V et al. | |
| 10,432,872 B2 | 10/2019 | Evans, V et al. | |
| 10,437,974 B2 | 10/2019 | He et al. | |
| 2011/0220901 A1* | 9/2011 | Ha | H10K 59/12 257/59 |
| 2016/0126494 A1* | 5/2016 | Jung | H10K 59/121 438/23 |
| 2016/0233289 A1* | 8/2016 | Son | H10K 59/124 |
| 2016/0308163 A1* | 10/2016 | Yoon | H10K 59/873 |
| 2017/0133444 A1* | 5/2017 | Lee | H10K 59/122 |

(Continued)

FOREIGN PATENT DOCUMENTS

| | | |
|---|---|---|
| EP | 3902010 A1 | 10/2021 |
| KR | 10-2018-0076429 A | 7/2018 |
| KR | 10-2020-0060594 A | 6/2020 |

*Primary Examiner* — Vongsavanh Sengdara
(74) *Attorney, Agent, or Firm* — Innovation Counsel LLP

(57) ABSTRACT

A display device including a transmissive area and a light emitting area surrounding the transmissive area includes a first substrate, a barrier layer disposed on the first substrate and including an inorganic material, a second substrate disposed on the barrier layer and including an opening overlapping the transmissive area, a light emitting element disposed on the second substrate and overlapping the light emitting area and an encapsulation layer covering the light emitting element and contacting the barrier layer in the transmissive area.

25 Claims, 12 Drawing Sheets

(56) References Cited

U.S. PATENT DOCUMENTS

| | | | |
|---|---|---|---|
| 2017/0221976 A1* | 8/2017 | Park | H10K 59/121 |
| 2018/0183015 A1 | 6/2018 | Yun et al. | |
| 2019/0214595 A1* | 7/2019 | Park | G06F 3/0412 |
| 2020/0144341 A1 | 5/2020 | Choi et al. | |
| 2020/0161582 A1 | 5/2020 | Choi et al. | |
| 2020/0194721 A1* | 6/2020 | Lee | H10K 59/874 |
| 2021/0335955 A1 | 10/2021 | Son et al. | |

* cited by examiner

DISPLAY DEVICE

This application claims priority to Korean Patent Application No. 10-2020-0160387 filed on Nov. 25, 2020, and all the benefits accruing therefrom under 35 U.S.C. § 119, the content of which in its entirety is herein incorporated by reference.

BACKGROUND

1. Field

The present disclosure relates to display devices. More particularly, the present disclosure relates to display devices that include a functional module.

2. Description of the Related Art

Recently, interest in display devices has increased. Accordingly, the display devices may be manufactured in various types, including an organic light emitting display device, a liquid crystal display, quantum-dot nano light emitting display device, and the like.

The display devices may include a functional module having various functions. External light may be incident on the functional module. There are various methods of disposing the functional module. For example, a hole penetrating the display panel may be formed, and the functional module may be disposed to overlap the hole. In this case, external moisture, foreign matter, and the like may flow in through the hole.

Therefore, in recent years, attempts have been made to dispose the functional module without forming a hole.

SUMMARY

A display device including a transmissive area and a light emtting area surrounding the transmissive area may include a first substrate, a barrier layer disposed on the first substrate and including an inorganic material, a second substrate disposed on the barrier layer and including an opening overlapping the transmissive area, a light emitting element disposed on the second substrate and overlapping the light emitting area and an encapsulation layer covering the light emitting element and contacting the barrier layer in the transmissive area.

In an embodiment, the encapsulation layer may include a first inorganic encapsulation layer disposed on the second substrate and including an inorganic material, an organic encapsulation layer disposed on the first inorganic encapsulation layer, having a flat top surface, and including an organic material and a second inorganic encapsulation layer disposed on the organic encapsulation layer and including an inorganic material.

In an embodiment, the first substrate may overlap the light emitting area, and includes an opening overlapping the transmissive area.

In an embodiment, the display device may further include a low refractive layer disposed under the first substrate, overlapping the light emitting area and the transmissive area, and having a refractive index lower than a refractive index of the first substrate.

In an embodiment, the low refractive layer may be in contact with the barrier layer.

In an embodiment, the display device may further include a low refractive layer disposed under the first substrate, overlapping the light emitting area, having a refractive index lower than a refractive index of the first substrate, and including an opening overlapping the transmissive area.

In an embodiment, the display device may further include a low refractive layer disposed under the first substrate, and having a refractive index lower than a refractive index of the first substrate.

In an embodiment, the low refractive layer may overlap the light emitting area and the transmissive area.

In an embodiment, the low refractive layer may overlap the light emitting area and the low refractive layer may include an opening overlapping the transmissive layer.

In an embodiment, each of the first substrate and the second substrate may include polyimide.

In an embodiment, the display device may further include a functional module disposed under the first substrate, and overlapping the transmissive area.

In an embodiment, the functional module may include at least one of a camera module, a face recognition sensor module, a pupil recognition sensor module, an acceleration sensor module, a proximity sensor module, an infrared sensor module, an illuminance sensor module, and a light sensor module.

In an embodiment, the barrier layer may overlap the light emitting area and the transmissive area.

In an embodiment, the display may further include at least one groove formed between the transmissive area and the light emitting area.

A display device including a transmissive area and a light emtting area surrounding the transmissive area may include a substrate including an opening overlapping the transmissive area, a barrier layer disposed on the substrate, and including an inorganic material, a light emitting element disposed on the barrier layer, and overlapping the light emitting area and an encapsulation layer covering the light emitting element, and being in contact with the barrier layer in the transmissive area.

In an embodiment, the encapsulation layer may include a first inorganic encapsulation layer disposed on the barrier layer and including an inorganic material, an organic encapsulation layer disposed on the first inorganic encapsulation layer, having a flat top surface, and including an organic material and a second inorganic encapsulation layer disposed on the organic encapsulation layer and including an inorganic material.

In an embodiment, the display device may further include at least one groove formed between the transmissive area and the light emitting area.

In an embodiment, the barrier layer may overlap the transmissive area and the light emitting area.

In an embodiment, the display device may further include a low refractive layer disposed under the substrate and having a refractive index lower than a refractive index of the substrate.

In an embodiment, the low refractive layer may overlap the light emitting area and the transmissive area.

In an embodiment, the low refractive layer may be in contact with the barrier layer.

In an embodiment, the low refractive layer may overlap the light emitting area and the low refractive layer includes an opening overlapping the transmissive layer.

In an embodiment, the substrate may include polyimide

In an embodiment, the display device may further include a functional module disposed under the first substrate, and overlapping the transmissive area.

In an embodiment, the functional module may include at least one of a camera module, a face recognition sensor module, a pupil recognition sensor module, an acceleration sensor module, a proximity sensor module, an infrared sensor module, an illuminance sensor module, and a light sensor module.

A display device including a transmissive area and a light emtting area surrounding the transmissive area may include a first substrate, a barrier layer disposed on the first substrate and including an inorganic material, a second substrate disposed on the barrier layer and including an opening overlapping the transmissive area, a light emitting element disposed on the second substrate and overlapping the light emitting area and an encapsulation layer covering the light emitting element and contacting the barrier layer in the transmissive area.

Accordingly, light can be efficiently transmitted to a functional module (e.g., a camera module, etc.) disposed to overlap the transmission area. In addition, by disposing a low refractive layer under the first substrate, refraction of light incident on the functional module may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Embodiments of the present disclosure provide a display device that allows improved light transmittance to a functional module.

Hereinafter, backlight units and display devices in embodiments will be explained in detail with reference to the accompanying drawings.

Figure 1:
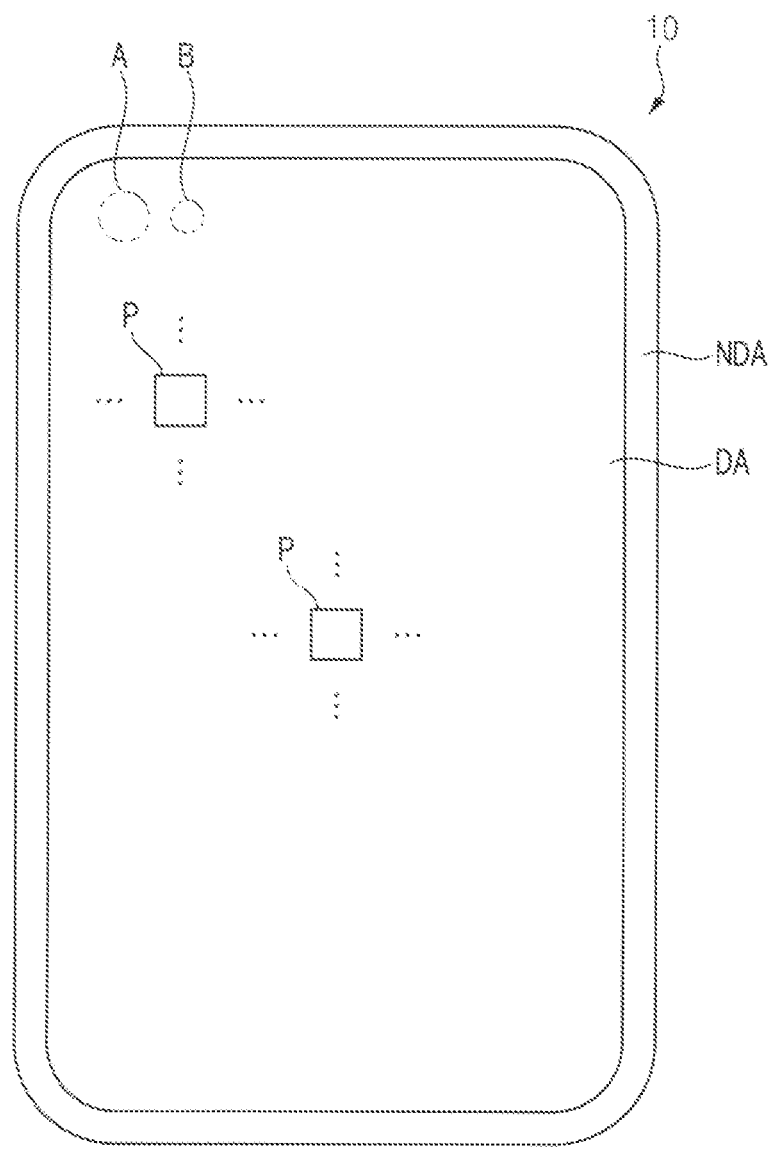
FIG. 1 is a plan view illustrating a display device according to an embodiment.

FIG. 1 illustrates a plan view of a display device according to an embodiment.

Referring to FIG. 1, the display device 10 may include a display area DA and a non-display area NDA. The non-display area NDA may surround the display area DA. but, this is exemplary, and the non-display area NDA may be formed on at least one side of the display area DA.

Also, the display device 10 may include an area A and an area B disposed in the display area DA. In embodiments, the display device 10 may include a functional module. The area A and the area B may be areas where the functional module is disposed. For example, the functional module may entirely overlap the area A. In addition, the functional module may entirely overlap the area B. For example, at least one of a camera module, a face recognition sensor module, a pupil recognition sensor module, an acceleration sensor module, a proximity sensor module, an infrared sensor module, an illuminance sensor module, and a light sensor module may be disposed in the area A or the area B.

In FIG. 1, two areas in which the functional module is disposed are illustrated, but this is only exemplary and is not limited thereto. For example, the number of areas in which the functional modules are disposed may be one, or three or more areas. In addition, different functional modules may be disposed in each of the areas, or the same functional modules may be disposed in each of the areas.

In embodiments, as illustrated in FIG. 1, the display device 10 may have a shape in which each vertex has a curvature. However, this is exemplary, and the display device 10 may have a circular shape having a curvature as a whole or a polygonal shape.

A plurality of pixels P may be disposed in the display area DA. In addition, the pixels P may also be disposed in the A area and the B area. The pixels P may include a driving element and a light emitting element. The driving element may include at least one transistor. The driving element and the light emitting element may be electrically connected. The pixels P may receive signals and display an image on the display area DA. The pixels P may be generally disposed in the display area DA. For example, the pixels P may be disposed in the display area DA in a matrix shape, a PENTILE™ shape, an S-stripe shape, or a diamond shape.

A plurality of drivers may be disposed in the non-display area NDA. For example, a gate driver, a light emitting control driver, and a data driver may be disposed in the non-display area NDA. The drivers may provide various signals (e.g., a gate signal, a data signal, a light emitting control signal, and the like.) to the pixels P.

Figure 2:
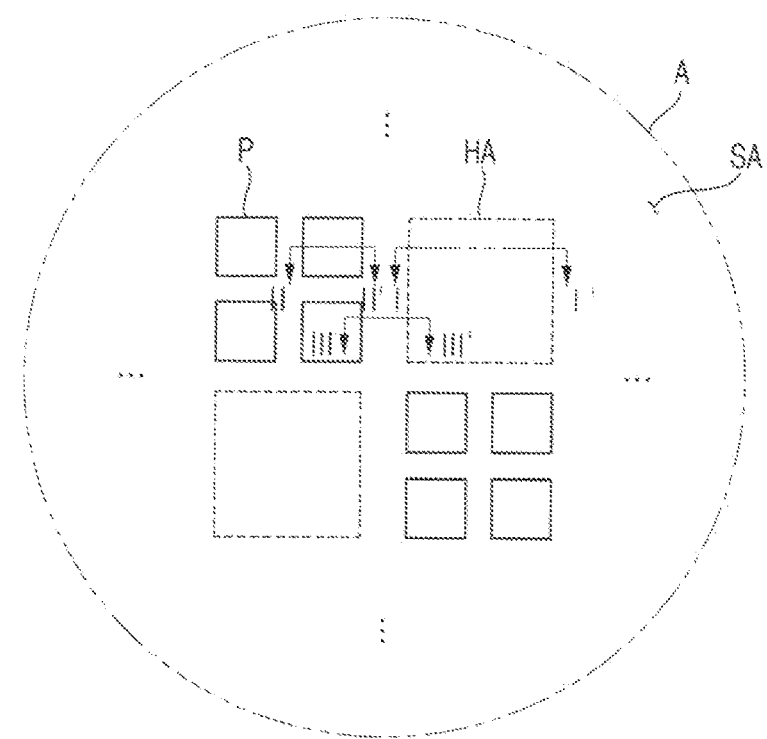
FIG. 2 illustrates an embodiment of an area A of FIG. 1.

FIG. 2 is an enlarged view illustrating an embodiment of area A of FIG. 1.

Referring to FIGS. 1 and 2, the pixels P may be disposed in the area A. A transmissive area HA may be disposed between the pixels P. The functional module may recognize external light through the transmissive area HA. In embodiments, an area surrounding the transmissive area HA may be defined as a light emitting area. The pixels P may be disposed in the light emitting area.

Conventionally, a hole is formed entirely in an area where the functional module is disposed, so that the pixels P cannot be disposed in the area. Accordingly, an image could not be displayed in the area where the functional module is disposed. In contrast, the display device 10 may display an image even in an area in which the functional module is disposed by recognizing external light through the transmissive areas HA disposed between the pixels P by the functional module. Accordingly, a dead space of the display device 10 may be reduced. In addition, in the display device 10, the transmissive areas HA may have a thinner thickness than the light emitting areas so that light can be effectively transmitted through the transmissive areas HA.

In FIG. 2, it is illustrated that two transmissive areas HA and eight pixels P are disposed in the area A, but this is exemplary and is not limited thereto. For example, at least one transmissive area HA and at least one pixel P may be disposed in the area A.

Figure 3:
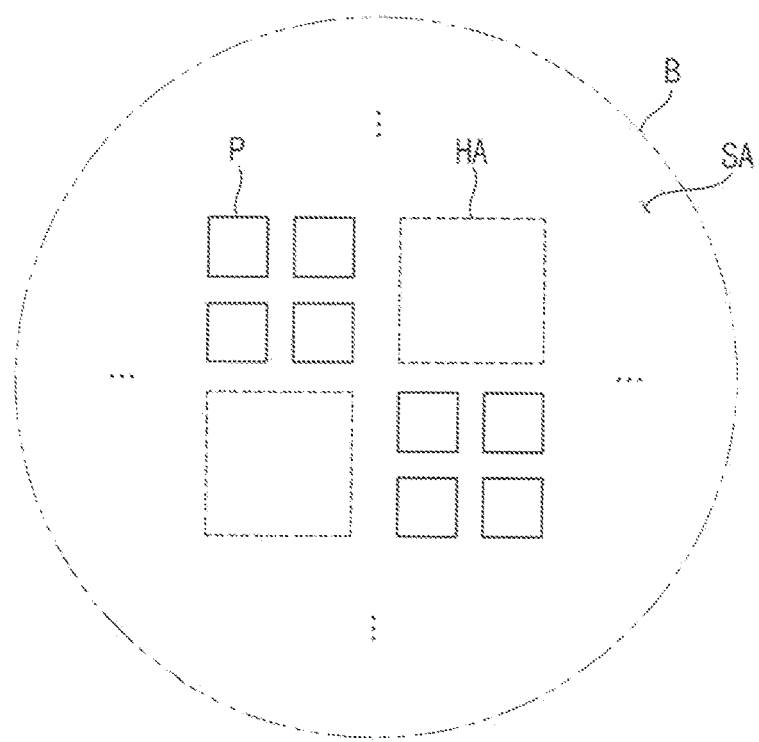
FIG. 3 illustrates an embodiment of an area B of FIG. 1.

FIG. 3 is an enlarged view illustrating an embodiment in which area B of FIG. 1 is enlarged.

Referring to FIGS. 1 and 3, the pixels P may be disposed in the area B. A transmissive area HA may be disposed between the pixels P. The functional module may recognize external light through the transmissive area HA. The area surrounding the transmissive area HA may be referred to as a surrounding area SA.

In this way, the functional module recognizes external light through the transmissive areas HA disposed between the pixels P, so that an image may be displayed even in an area in which the functional module is disposed.

In FIG. 3, it is illustrated that two transmissive areas HA and eight pixels P are disposed in the area A, but this is exemplary and is not limited thereto. For example, at least one transmissive area HA and at least one pixel P may be disposed in the area A. However, in embodiments, the area B may have a relatively smaller area than the area A. Accordingly, the area B may include a relatively smaller transmissive area HA than the area A.

In embodiments, the same functional module may be disposed in the area A and the area B, or different functional modules may be disposed in the area A and the area B.

Figure 4:
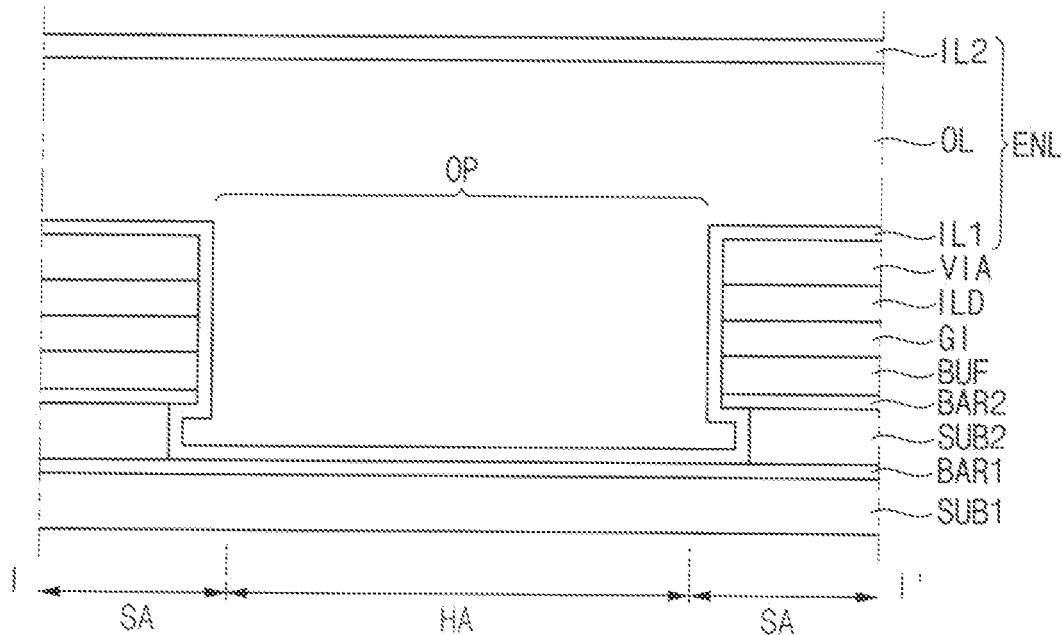
FIG. 4 is a cross-sectional view illustrating an embodiment taken along the line I-I' of FIG. 2.

FIG. 4 is a cross-sectional view illustrating an embodiment taken along the line I-I' of FIG. 2.

Referring to FIGS. 1, 2 and 4, the display device 10 may include a first substrate SUB1, a first barrier layer BAR1, a second substrate SUB2, a second barrier layer BAR2, a buffer layer BUF, a gate insulating layer GI, an interlayer insulating layer ILD, a via insulating layer VIA, and an encapsulation layer ENL. In embodiments, the encapsulation layer ENL may include a first inorganic encapsulation layer ILL an organic encapsulation layer OL, and a second inorganic encapsulation layer IL2. However, the structure of the encapsulation layer ENL may not be limited thereto. For example, the encapsulation layer ENL may further include a second organic encapsulation layer disposed on the second inorganic encapsulation layer IL2 and a third inorganic encapsulation layer disposed on the second organic encapsulation layer.

In embodiments, the first substrate SUB1 may include a glass material including silicon. For example, the first substrate SUB1 may include silicon dioxide ("SiO2"). Accordingly, the first substrate SUB1 may have rigid characteristics. Alternatively, in embodiments, the first substrate SUB1 may include plastic. For example, the first substrate SUB1 may include polyethersulfone, polyacrylate, polyether imide, polyethylene naphalate, polyethylene terephthalate, polyphenylene sulfide, polyarylate, polyimide, polycarbonate, cellulose Triacetate, cellulose acetate propionate, and the like. Accordingly, the first substrate SUB1 may have flexible characteristics.

The first barrier layer BAR1 may be disposed on the first substrate SUB1. The first barrier layer BAR1 may include the transmissive area HA and the surrounding area SA surrounding the transmissive area HA. In embodiments, the transmissive area HA may be the transmissive area HA. The first barrier layer BAR1 may prevent foreign substances from penetrating into the display device 10. The first bather layer BAR1 may include silicon oxide, silicon nitride, silicon oxynitride, or the like.

The second substrate SUB2 may be disposed on the first barrier layer BAR1. The second substrate SUB2 may overlap the surrounding area SA of the first barrier layer BAR1. That is, the second substrate SUB2 may include an opening OP exposing the transmissive area HA of the first barrier layer BAR1. Through this, light may be transmitted to the functional module disposed to overlap the transmissive area HA. That is, light that has not passed through the second substrate SUB2 may be transmitted to the functional module. In embodiments, the second substrate SUB2 may include a glass material including silicon. Alternatively, in embodiments, the second substrate SUB2 may include plastic.

The second barrier layer BAR2 may be disposed on the second substrate SUB2. The second barrier layer BAR2 may overlap the surrounding area SA. The second barrier layer BAR2 may prevent foreign substances from penetrating into the display device 10. The second barrier layer BAR2 may include silicon oxide, silicon nitride, silicon oxynitride, or the like.

The buffer layer BUF may be disposed on the second barrier layer BAR2. The buffer layer BUF may provide a flat top surface on the second barrier layer BAR2. In addition, the buffer layer BUF may prevent foreign matter or moisture from penetrating into the display device 10. The buffer layer BUF may include an organic material and/or an inorganic material. For example, the buffer layer BUF may include an inorganic material such as a silicon-based material, an aluminum-based material, and a titanium-based material. In addition, the buffer layer BUF may include an organic material such as polyimide, polyester, or acrylic.

The gate insulating layer GI may be disposed on the buffer layer BUF. The gate insulating layer GI may include an inorganic insulating material. For example, the gate insulating layer GI may include silicon oxide, silicon nitride, silicon oxynitride, or the like.

The interlayer insulating layer ILD may be disposed on the gate insulating layer GI. The interlayer insulating layer ILD may include an inorganic insulating material. For example, the interlayer insulating layer ILD may include silicon oxide, silicon nitride, silicon oxynitride, or the like.

The via insulating layer VIA may be disposed on the interlayer insulating layer ILD. The via insulating layer VIA may have a flat top surface on which the light emitting element is disposed. Accordingly, the via insulating layer VIA may be defined as a planarization layer. The via insulating layer VIA may include an organic insulating material. For example, the via insulating layer VIA may include acrylic, benzocyclobutene (BCB), hexamethyldisiloxane (HMDSO), or the like.

However, the structure of the insulating layers disposed on the buffer layer BUF is exemplary and is not limited thereto. For example, the display device 10 may include a plurality of via insulating layers. Also, the display device 10 may include a plurality of gate insulating layers and/or a plurality of interlayer insulating layers.

The functional module may be disposed to overlap the transmissive area HA. The second substrate SUB2 to the via insulating layer VIA may not be disposed in the transmissive area HA to allow the transmittance of light through the transmissive area HA. That is, an area where each of the second substrate SUB2 to the via insulating layer VIA overlaps the transmissive area HA that is the transmission area HA may be etched. That is, the transmissive area HA of the first barrier layer BAR1 may be exposed. Through this, light may be transmitted to the functional module through the transmissive area HA. In addition, it is possible to allow transmittance of light to the functional module.

The encapsulation layer ENL may be disposed on the via insulating layer VIA. The encapsulation layer ENL may prevent external moisture or oxygen from penetrating into the display device 10.

The first inorganic encapsulation layer IL1 may be disposed on the via insulating layer VIA. In embodiments, the first inorganic encapsulation layer IL1 may overlap the transmissive area HA and the surrounding area SA. In addition, in embodiments, the first inorganic encapsulation layer IL1 may contact the first barrier layer BAR1. The first inorganic encapsulation layer IL1 may include silicon oxide, silicon nitride, silicon oxide, or the like.

The organic encapsulation layer OL may be disposed on the first inorganic encapsulation layer ILL Since the first inorganic encapsulation layer IL1 is formed along a structure disposed under the first inorganic encapsulation layer ILL the top surface of the first inorganic encapsulation layer IL1 may not be flat. The organic encapsulation layer OL covers the first inorganic encapsulation layer IL1 and has a sufficient thickness to have an overall flat top surface. The organic encapsulation layer OL may compensate for a step difference in the transmissive area HA where the insulating layer or the like is etched. The organic encapsulation layer OL may include polyethylene terephthalate, polyethylene naphthalate, polycarbonate, polyimide, polyethylene sulfonate, polyoxymethylene, polyarylate, hexamethyldisiloxane, acrylic resin, and the like.

The second inorganic encapsulation layer IL2 may be disposed to cover the organic encapsulation layer OL. The second inorganic encapsulation layer IL2 may include silicon oxide, silicon nitride, silicon oxynitride, or the like. In this way, the encapsulation layer ENL may prevent moisture or oxygen from permeating into the display device 10 through a structure in which a plurality of layers are stacked.

Figure 5:
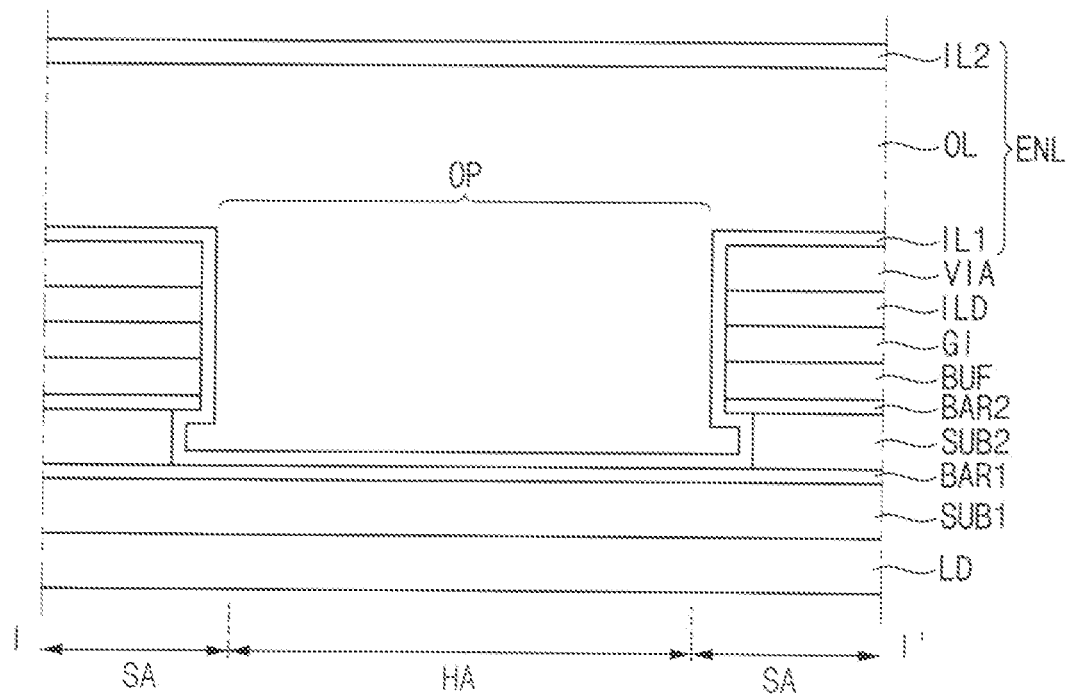
FIG. 5 is a cross-sectional view illustrating an embodiment taken along the line I-I' of FIG. 2.

FIG. 5 is a cross-sectional view illustrating an embodiment taken along the line I-I' of FIG. 2. FIG. 5 may be substantially the same as FIG. 4 except that a low refractive layer is further disposed. Therefore, a description of the overlapping configuration will be omitted.

Referring to FIGS. 1, 2, 4 and 5, the display device 10 may include a low refractive layer LD. The low refractive layer LD may be disposed under the first substrate SUB1. The low refractive layer LD may have a relatively low refractive index compared to the first substrate SUB1 and the second substrate SUB2. For example, light may be refracted relatively less due to the low refractive layer LD, and then transmitted to the functional module. In embodiments, the low refractive layer LD may include an acrylic resin.

Conventionally, a polymer film (e.g., polyethylene terephthalate) was disposed under the first substrate SUB1. As the polymer film is disposed under the first substrate SUB1 in a stretched state, molecules are aligned to refract or diffract transmitted light. In addition, since the low refractive layer LD is cured by ultraviolet rays after printing without needing to be stretched, high transmittance can be secured compared to the prior art.

In embodiments, the low refractive layer LD may be disposed under the first substrate SUB1. The low refractive layer LD may overlap the transmissive area HA and the surrounding area SA of the first barrier layer BAR1. That is, the low refractive layer LD may also be disposed in the transmissive area HA.

Figure 6:
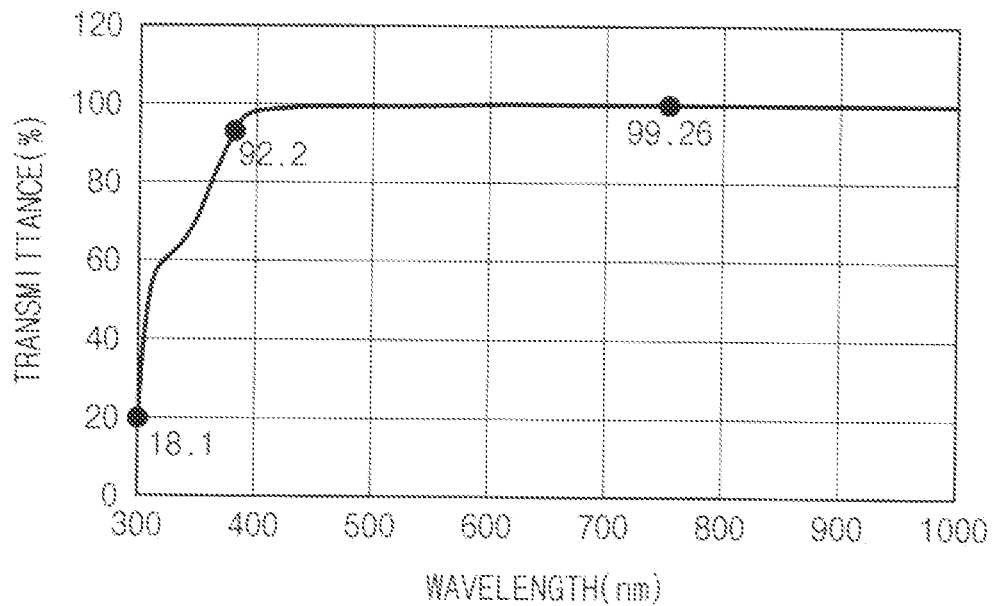
FIG. 6 is a diagram illustrating the transmittance of a low refractive layer of FIG. 4 by way of example.

FIG. 6 is a diagram illustrating the transmittance of the low refractive layer of FIG. 4 by way of example.

Referring to FIGS. 5 and 6, the low refractive layer LD may efficiently transmit light. For example, the low refractive layer LD may transmit about 92.2 to 99.26 percent of light having a wavelength in the visible region (e.g., about 380 to 750 nanometers). The low refractive index layer LD may transmit an average of about 98.97% of light having a wavelength in a visible region.

Figure 7:
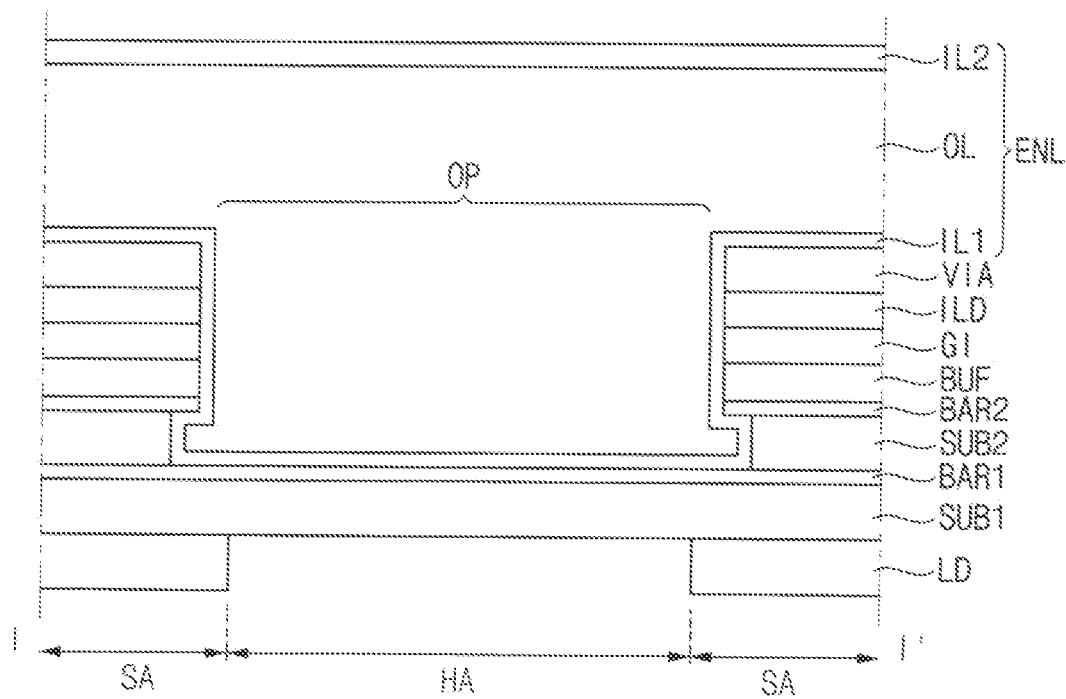
FIG. 7 is a cross-sectional view illustrating an embodiment taken along the line I-I' of FIG. 2.

FIG. 7 is a cross-sectional view illustrating an embodiment taken along the line I-I' of FIG. 2. FIG. 7 may be substantially the same as FIG. 5 except for the structure of the low refractive layer LD. Accordingly, a description of the overlapping configuration will be omitted.

Referring to FIGS. 5 and 7, the low refractive layer LD may be disposed under the first substrate SUB1. In embodiments, the low refractive layer LD may overlap the surrounding area SA. That is, the low refractive layer LD may be disposed to be spaced apart from the transmissive area HA and overlap the surrounding area SA. Through this, external light may be transmitted to the functional module disposed to overlap the transmissive area HA without passing through the low refractive layer LD. That is, light with relatively less refraction may be transmitted to the functional module.

Figure 8:
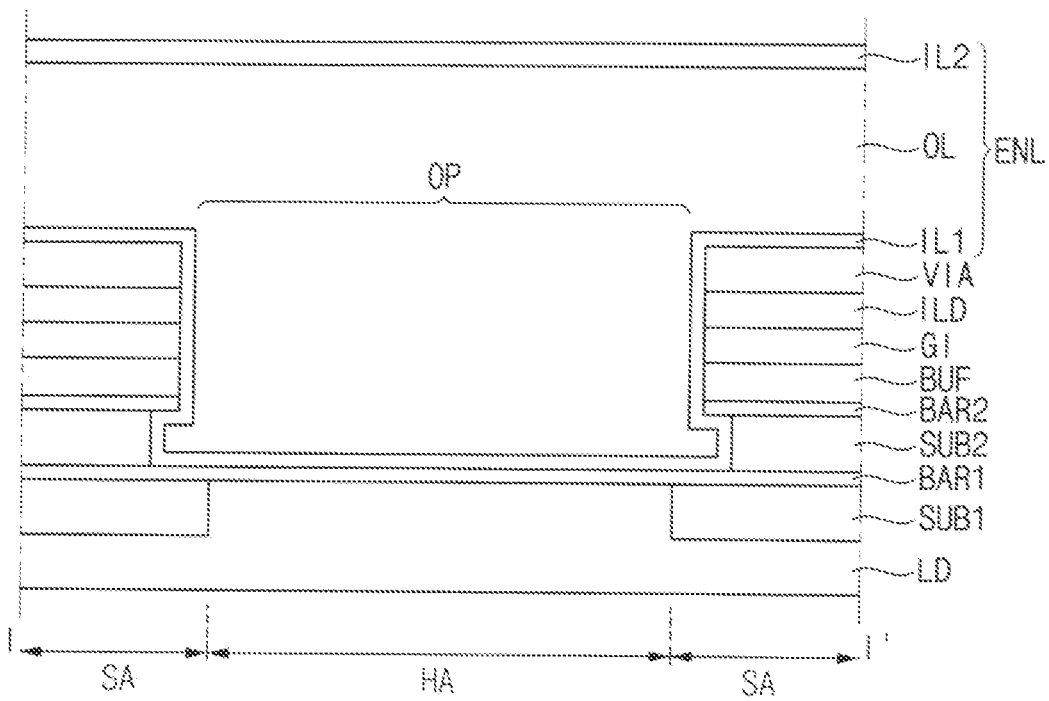
FIG. 8 is a cross-sectional view illustrating an embodiment taken along the line I-I' of FIG. 2.

FIG. 8 is a cross-sectional view illustrating an embodiment taken along the line I-I' of FIG. 2. FIG. 8 may be substantially the same as that of FIG. 5 except for the structure of the low refractive layer and the first substrate. Accordingly, a description of the overlapping configuration will be omitted.

Referring to FIGS. 1, 2, 5 and 8, the first substrate SUB1 may be disposed under the first barrier layer BAR1. In embodiments, the first substrate SUB1 may have an opening OP exposing the transmissive area HA of the first barrier layer BAR1. The first substrate SUB1 may overlap only with the surrounding area SA and may not overlap with the transmissive area HA. That is, the first substrate SUB1 may not be disposed in the transmissive area HA.

In embodiments, the low refractive layer LD may be disposed under the first substrate SUB1. The low refractive layer LD may overlap the transmissive area HA and the surrounding area SA. The low refractive layer LD may contact the transmissive area HA of the first barrier layer BAR1.

In embodiments, the refractive index of the low refractive layer LD may be lower than that of the first substrate SUB1. Accordingly, refraction may be less than when light passes through the first substrate SUB1 and the low refractive layer LD.

Figure 9:
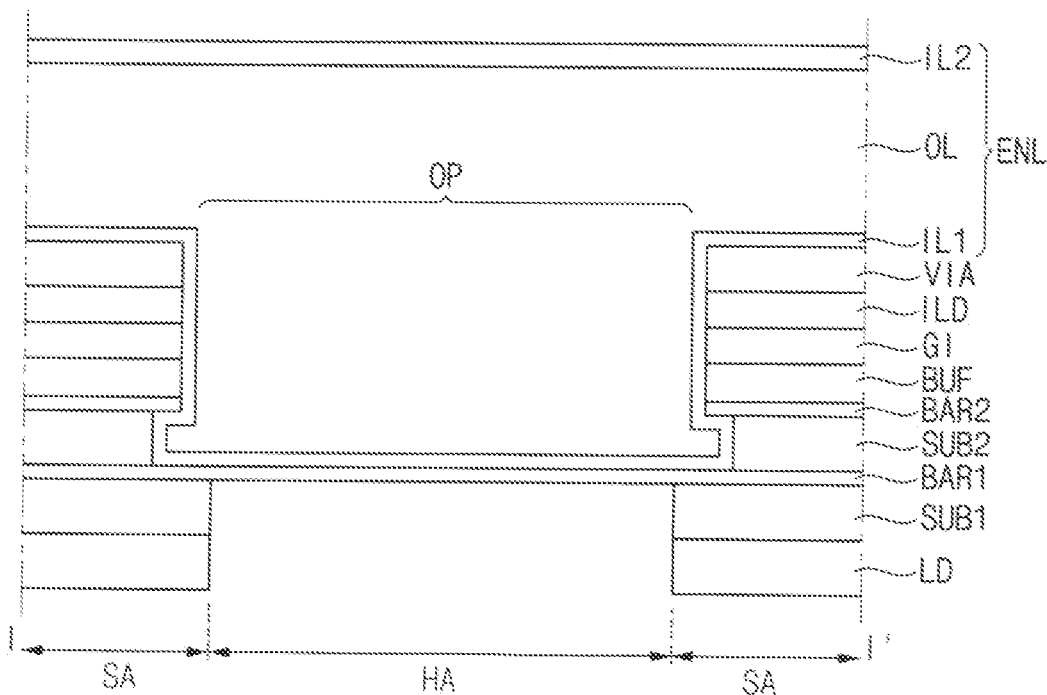
FIG. 9 is a cross-sectional view illustrating an embodiment taken along the line I-I' of FIG. 2.

FIG. 9 is a cross-sectional view illustrating an embodiment taken along the line I-I' of FIG. 2. FIG. 9 may be substantially the same as that of FIG. 8 except for the structure of the low refractive layer. Accordingly, a description of the overlapping configuration will be omitted.

Referring to FIGS. 1, 2, 8 and 9, the low refractive layer LD may be disposed under the first substrate SUB1. In embodiments, the low refractive layer LD may overlap only the surrounding area SA. In addition, the functional module may be disposed under the first barrier layer BAR1 to overlap the transmissive area HA. Through this, light transmitted through the first region, the transmissive area HA, may be transmitted to the functional module without passing through the first substrate SUB1 and the low refractive layer LD. Accordingly, relatively less refracted light may be transmitted to the functional module.

Figure 10:
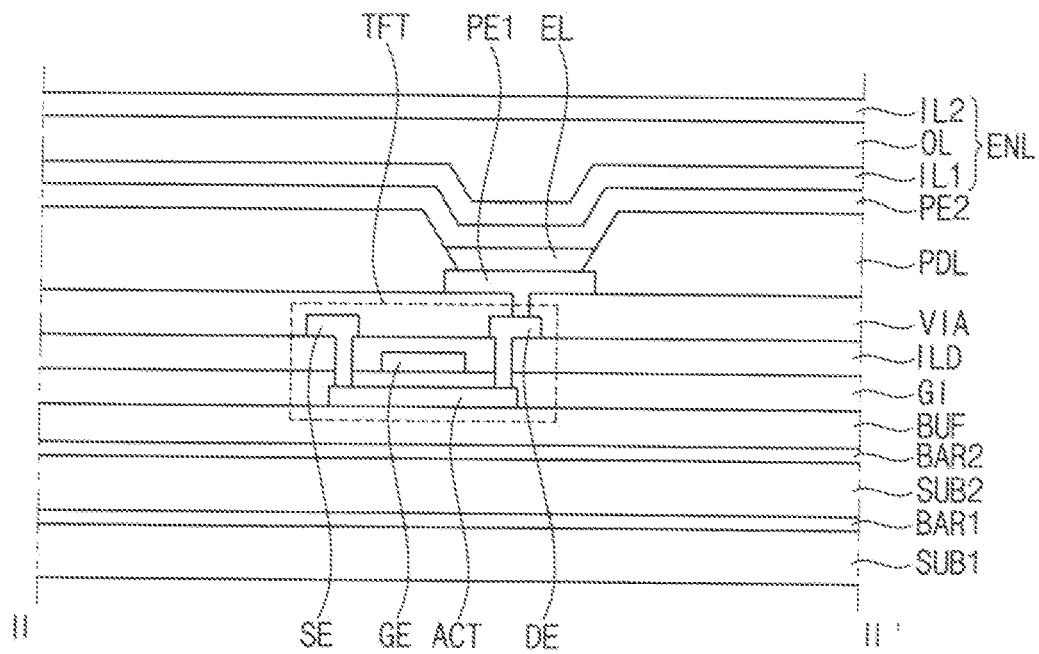
FIG. 10 is a cross-sectional view illustrating an embodiment taken along the line II-II' of FIG. 2.

FIG. 10 is a cross-sectional view illustrating an embodiment taken along the line II-II' of FIG. 2.

Referring to FIGS. 1, 2 and 10, the display device 10 may include pixels P disposed in the A area and the B area. The pixels P may include at least one transistor and a light emitting element. In FIG. 10, a transistor TFT is illustrated as an example of the at least one transistor. In embodiments, the pixels P may further include separate transistor In embodiments, the transistor TFT may include an active layer ACT, a gate electrode GE, a source electrode SE, and a drain electrode DE. In embodiments, the light emitting element may include a pixel electrode PE1, an intermediate layer EL, and a counter electrode PE2. The structure of the light emitting element is illustrative and is not limited thereto.

The active layer ACT may be disposed on the buffer layer BUF. The active layer ACT may include a semiconductor material. In embodiments, the active layer ACT may include a silicon-based semiconductor material. Alternatively, in embodiments, the active layer ACT may include an oxide-based semiconductor material.

The gate electrode GE may be disposed on the gate insulating layer GI. The gate electrode GE may overlap the active layer ACT. In embodiments, the gate electrode GE may include a conductive material. For example, the gate electrode GE may include at least one of aluminum, platinum, palladium, silver, magnesium, gold, nickel, neodymium, iridium, chromium, lithium, calcium, molybdenum, titanium, tungsten, and copper. When a signal is applied to the gate electrode GE, the source electrode SE and the drain electrode DE may be electrically connected.

The source electrode SE and the drain electrode DE may be disposed on the interlayer insulating layer ILD. Each of the source electrode SE and the drain electrode DE may be connected to the active layer ACT through a contact hole. In embodiments, each of the source electrode SE and the drain electrode DE may include a conductive material. For example, each of the source electrode SE and the drain electrode DE may include at least one of aluminum, platinum, palladium, silver, magnesium, gold, nickel, neodymium, iridium, chromium, lithium, calcium, molybdenum, titanium, tungsten, and copper The pixel electrode PE1 may be disposed on the via insulating layer VIA. The pixel electrode PE1 may be connected to the drain electrode DE through a contact hole. In embodiments, the pixel electrode PE1 may include a conductive material. For example, the pixel electrode PE1 may include at least one of ITO, IZO, IGO, AZO, and IGZO. However, this is exemplary, and the material included in the pixel electrode PE1 is not limited thereto. For example, the pixel electrode PE1 may further include the same material as the gate electrode GE.

The pixel defining layer PDL may be disposed to cover at least a portion of the pixel electrode PE1. The pixel defining layer PDL may have an opening exposing at least a portion of the pixel electrode PE1.

The intermediate layer EL may be disposed on the pixel electrode PE1. The intermediate layer EL may include a light emitting layer. In addition, the intermediate layer EL may further include at least one functional layer of a hole injection layer, a hole transporting layer, an electron injection layer, and an electron transporting layer. The functional layers may include an organic material.

The counter electrode PE2 may be disposed on the intermediate layer EL to cover the pixel defining layer PDL.

The counter electrode PE2 may include a metal having a small work function. For example, the counter electrode PE2 may include at least one of lithium, calcium, aluminum, silver, and magnesium. Alternatively, the counter electrode PE2 may include the same material as the pixel electrode PE1.

In embodiments, the pixel electrode PE1 may be an anode electrode, and the counter electrode PE2 may be a cathode electrode. In addition, in embodiments, the pixel electrode PE1 may be a cathode electrode, and the counter electrode PE2 may be an anode electrode.

Figure 11:
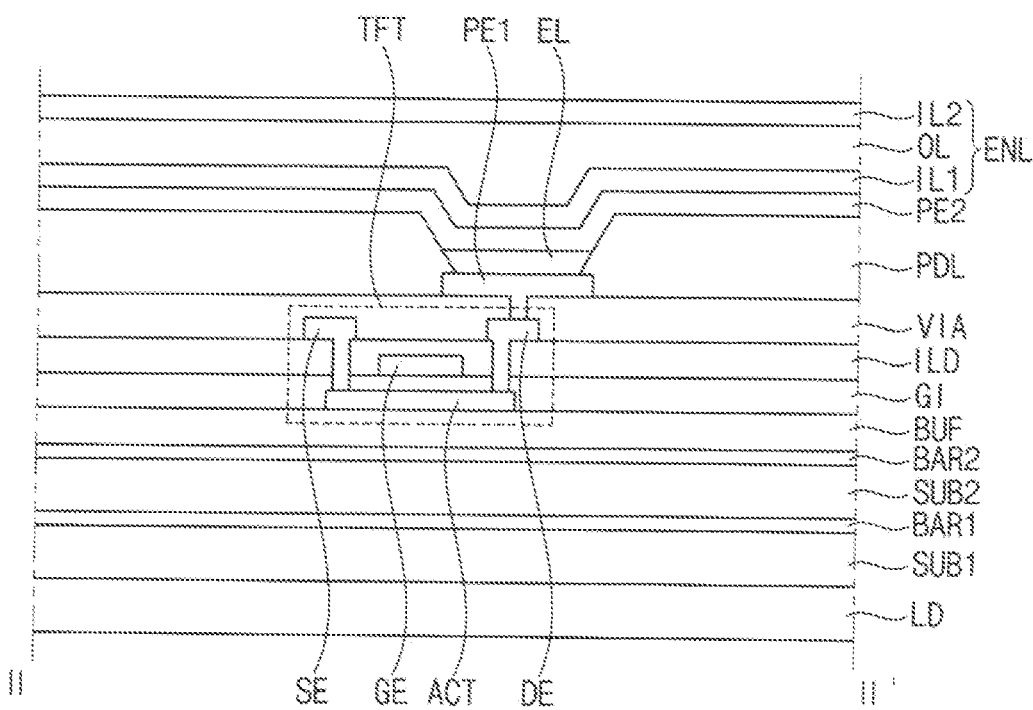
FIG. 11 is a cross-sectional view illustrating an embodiment taken along the line II-II' of FIG. 2.

FIG. 11 is a cross-sectional view illustrating an embodiment taken along the line II-II' of FIG. 2. FIG. 11 may be substantially the same as FIG. 10 except that a low refractive layer is added under the substrate. Accordingly, a description of the overlapping configuration will be omitted.

Figure 12:
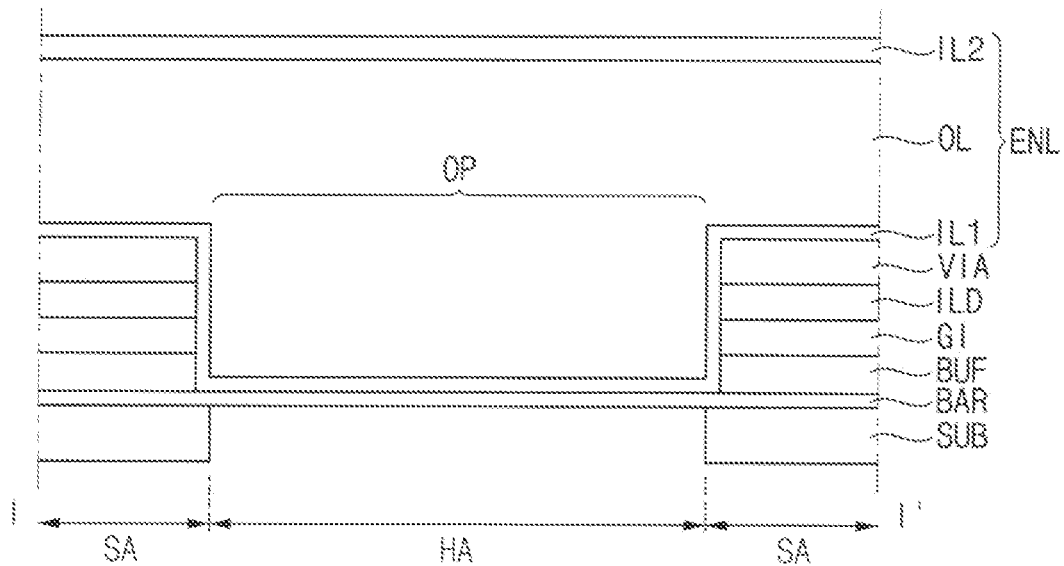
FIG. 12 is a cross-sectional view illustrating an embodiment taken along the line I-I' of FIG. 2.

FIG. 12 is a cross-sectional view illustrating an embodiment taken along the line I-I' of FIG. 2.

Referring to FIGS. 1, 2 and 12, the display device 10 may include a substrate SUB, a barrier layer BAR, a buffer layer BUF, a gate insulating layer GI, an interlayer insulating layer ILD, a via insulating layer VIA and an encapsulation layer ENL. In embodiments, the encapsulation layer ENL may include a first inorganic encapsulation layer IL1, an organic encapsulation layer OL and a second inorganic encapsulation layer IL2. However, the structure of the encapsulation layer ENL may not be limited thereto. For example, the encapsulation layer ENL may further include a second organic encapsulation layer disposed on the second inorganic encapsulation layer IL2 and a third inorganic encapsulation layer disposed on the second organic encapsulation layer.

In embodiments, the substrate SUB may include a glass material including silicon. For example, the substrate SUB may include silicon dioxide ("SiO2"). Alternatively, in embodiments, the substrate SUB may include plastic. For example, the substrate SUB may include polyethersulfone, polyacrylate, polyether imide, polyethylene naphalate, polyethylene terephthalate, polyphenylene sulfide, polyarylate, polyimide, polycarbonate, cellulose Triacetate, cellulose acetate propionate, and the like.

The barrier layer BAR may be disposed on the substrate SUB. The barrier layer BAR may include the transmissive area HA and the surrounding area SA surrounding the transmissive area HA. In embodiments, the transmissive area HA may be the transmissive area HA. The barrier layer BAR may prevent foreign substances from penetrating into the display device 10. The barrier layer BAR may include silicon oxide, silicon nitride, silicon oxynitride, or the like.

The functional module may be disposed to overlap the transmissive area HA. The substrate SUB may be disposed under the barrier layer BAR to overlap the surrounding area SA. That is, the substrate SUB may include an opening OP exposing the transmissive area HA of the barrier layer BAR. Through this, light may be relatively less refracted and transmitted to the functional module through the transmissive area HA. In addition, it is possible to secure transmittance of light transmitted from the transmissive area HA to the functional module.

The buffer layer BUF may be disposed on the second barrier layer BAR2. The buffer layer BUF may overlap the surrounding area SA. The buffer layer BUF may provide a flat top surface on the barrier layer BAR. In addition, the buffer layer BUF may prevent foreign matter or moisture from penetrating into the display device 10. The buffer layer BUF may include an organic material and/or an inorganic material. For example, the buffer layer BUF may include an inorganic material such as a silicon-based material, an aluminum-based material, and a titanium-based material. In addition, the buffer layer BUF may include an organic material such as polyimide, polyester, or acrylic.

The gate insulating layer GI may be disposed on the buffer layer BUF. The gate insulating layer GI may include an inorganic insulating material. For example, the gate insulating layer GI may include silicon oxide, silicon nitride, silicon oxynitride, or the like.

The interlayer insulating layer ILD may be disposed on the gate insulating layer GI. The interlayer insulating layer ILD may include an inorganic insulating material. For example, the interlayer insulating layer ILD may include silicon oxide, silicon nitride, silicon oxynitride, or the like.

The via insulating layer VIA may be disposed on the interlayer insulating layer ILD. The via insulating layer VIA may have a flat top surface on which the light emitting element is disposed. Accordingly, the via insulating layer VIA may be defined as a planarization layer. The via insulating layer VIA may include an organic insulating material. For example, the via insulating layer VIA may include acrylic, benzocyclobutene (BCB), hexamethyldisiloxane (HMDSO), or the like.

The buffer layer BUF to the via insulating layer VIA may not be disposed in the transmissive area HA to secure the transmittance of the transmissive area HA. That is, an area where each of the buffer layer BUF to the via insulating layer VIA overlaps the transmissive area HA that is the transmission area HA may be etched. That is, the transmissive area HA of the barrier layer BAR may be exposed.

However, the structure of the insulating layers disposed on the buffer layer BUF is exemplary and is not limited thereto. For example, the display device 10 may include a plurality of via insulating layers. Also, the display device 10 may include a plurality of gate insulating layers and/or a plurality of interlayer insulating layers.

The encapsulation layer ENL may be disposed on the via insulating layer VIA. The encapsulation layer ENL may prevent external moisture or oxygen from penetrating into the display device 10.

The first inorganic encapsulation layer IL1 may be disposed on the via insulating layer VIA. In embodiments, the first inorganic encapsulation layer IL1 may overlap the transmissive area HA and the surrounding area SA. In addition, in embodiments, the first inorganic encapsulation layer IL1 may contact the barrier layer BAR. The first inorganic encapsulation layer IL1 may include silicon oxide, silicon nitride, silicon oxide, or the like.

The organic encapsulation layer OL may be disposed on the first inorganic encapsulation layer IL1. Since the first inorganic encapsulation layer IL1 is formed along a structure disposed under the first inorganic encapsulation layer IL1, the top surface of the first inorganic encapsulation layer IL1 may not be flat. The organic encapsulation layer OL covers the first inorganic encapsulation layer IL1 and has a sufficient thickness to have an overall flat top surface. The organic encapsulation layer OL may compensate for a step difference in the transmissive area HA where the insulating layer or the like is etched. The organic encapsulation layer OL may include polyethylene terephthalate, polyethylene naphthalate, polycarbonate, polyimide, polyethylene sulfonate, polyoxymethylene, polyarylate, hexamethyldisiloxane, acrylic resin, and the like.

The second inorganic encapsulation layer IL2 may be disposed to cover the organic encapsulation layer OL. The second inorganic encapsulation layer IL2 may include silicon oxide, silicon nitride, silicon oxynitride, or the like. In this way, the encapsulation layer ENL may prevent moisture or oxygen from permeating into the display device 10 through a structure in which a plurality of layers are stacked.

Figure 13:
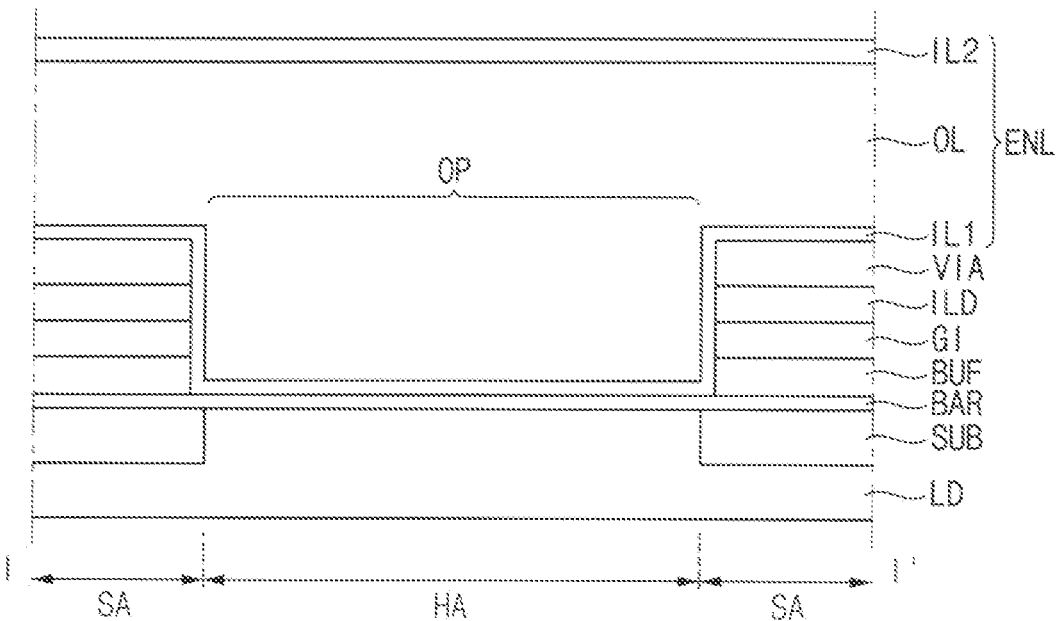
FIG. 13 is a cross-sectional view illustrating an embodiment taken along the line I-I' of FIG. 2.

FIG. 13 is a cross-sectional view illustrating an embodiment taken along the line I-I' of FIG. 2. FIG. 13 may be substantially the same as FIG. 12 except that a low refractive layer is added under the substrate. Accordingly, a description of the overlapping configuration will be omitted.

Referring to FIGS. 1, 2, 12 and 13, the display device 10 may include a low refractive layer LD. The low refractive layer LD may disposed under the substrate SUB. In embodiments, the low refractive layer LD may overlap the transmissive area HA and the surrounding area SA. In addition, in embodiments, the low refractive layer LD may contact the barrier layer BAR.

The low refractive layer LD may have a relatively low refractive index compared to the substrate SUB. For example, light may be refracted relatively less due to the low refractive layer LD, and then transmitted to the functional module. In embodiments, the low refractive layer LD may include an acrylic resin. Conventionally, a polymer film (e.g., polyethylene terephthalate) was disposed under the substrate SUB. Through this, light may be less refracted and transmitted to the functional module than in the related art. In addition, the low refractive layer LD can secure high transmittance compared to the convention. The low refractive layer may be printed under the substrate SUB and then cured by ultraviolet rays.

Figure 14:
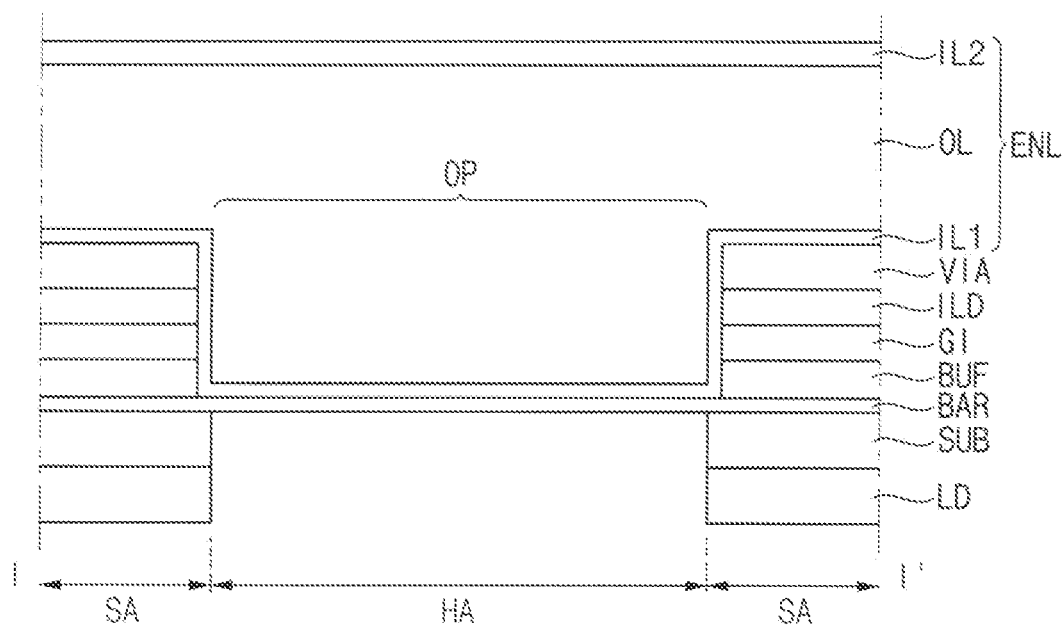
FIG. 14 is a cross-sectional view illustrating an embodiment taken along the line I-I' of FIG. 2.

FIG. 14 is a cross-sectional view illustrating an embodiment taken along the line I-I' of FIG. 2. FIG. 14. may be substantially the same as that of FIG. 13 except for the structure of the low refractive layer. Accordingly, a description of the overlapping configuration will be omitted.

Referring to FIGS. 1, 2, 13 and 14, the low refractive layer LD may be disposed under the first substrate SUB1. In embodiments, the low refractive layer LD may overlap only the surrounding area SA. Through this, the substrate SUB and the low refractive layer LD may not be disposed in the transmissive area HA in which the functional module is disposed. Accordingly, light transmitted to the functional module may be relatively less refracted.

Figure 15:
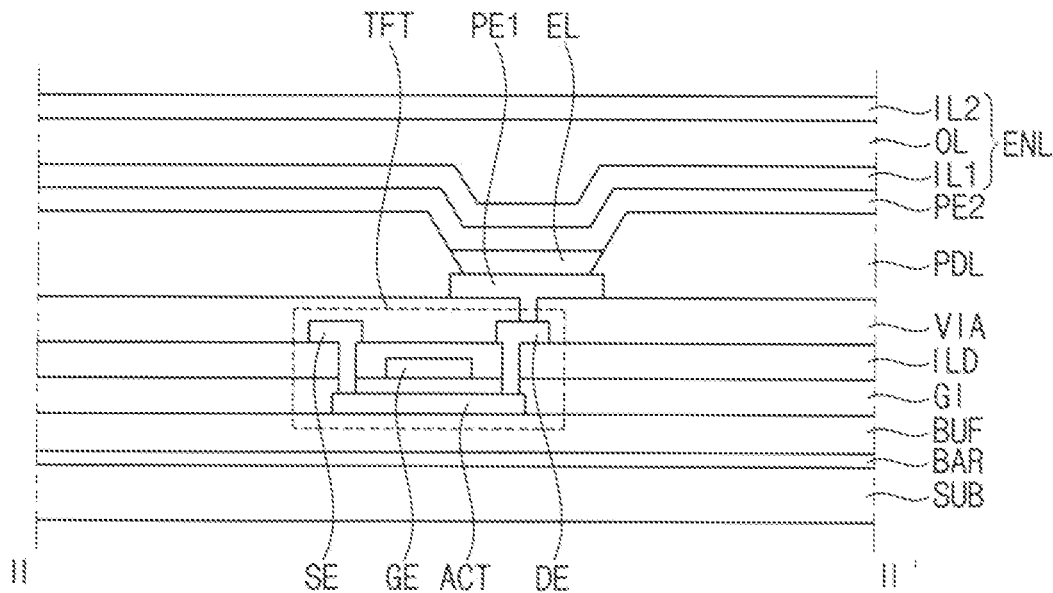
FIG. 15 is a cross-sectional view illustrating an embodiment taken along the line II-II' of FIG. 2.

FIG. 15 is a cross-sectional view illustrating an embodiment taken along the line II-II' of FIG. 2.

Referring to FIGS. 1, 2 and 15, the display device 10 may include pixels P disposed in the A area and the B area. The pixels P may include at least one transistor and a light emitting element. In FIG. 15, a transistor TFT is illustrated as an example of the at least one transistor. In embodiments, the pixels P may further include separate transistor In embodiments, the transistor TFT may include an active layer ACT, a gate electrode GE, a source electrode SE, and a drain electrode DE. In embodiments, the light emitting element may include a pixel electrode PE1, an intermediate layer EL, and a counter electrode PE2. The structure of the light emitting element is illustrative and is not limited thereto.

The active layer ACT may be disposed on the buffer layer BUF. The active layer ACT may include a semiconductor material. In embodiments, the active layer ACT may include a silicon-based semiconductor material. Alternatively, in embodiments, the active layer ACT may include an oxide-based semiconductor material.

The gate electrode GE may be disposed on the gate insulating layer GI. The gate electrode GE may overlap the active layer ACT. In embodiments, the gate electrode GE may include a conductive material. For example, the gate electrode GE may include at least one of aluminum, platinum, palladium, silver, magnesium, gold, nickel, neodymium, iridium, chromium, lithium, calcium, molybdenum, titanium, tungsten, and copper. When a signal is applied to the gate electrode GE, the source electrode SE and the drain electrode DE may be electrically connected.

The source electrode SE and the drain electrode DE may be disposed on the interlayer insulating layer ILD. Each of the source electrode SE and the drain electrode DE may be connected to the active layer ACT through a contact hole. In embodiments, each of the source electrode SE and the drain electrode DE may include a conductive material. For example, each of the source electrode SE and the drain electrode DE may include at least one of aluminum, platinum, palladium, silver, magnesium, gold, nickel, neodymium, iridium, chromium, lithium, calcium, molybdenum, titanium, tungsten, and copper The pixel electrode PE1 may be disposed on the via insulating layer VIA. The pixel electrode PE1 may be connected to the drain electrode DE through a contact hole. In embodiments, the pixel electrode PE1 may include a conductive material. For example, the pixel electrode PE1 may include at least one of ITO, IZO, IGO, AZO, and IGZO. However, this is exemplary, and the material included in the pixel electrode PE1 is not limited thereto. For example, the pixel electrode PE1 may further include the same material as the gate electrode GE.

The pixel defining layer PDL may be disposed to cover at least a portion of the pixel electrode PE1. The pixel defining layer PDL may have an opening exposing at least a portion of the pixel electrode PE1.

The intermediate layer EL may be disposed on the pixel electrode PE1. The intermediate layer EL may include a light emitting layer. In addition, the intermediate layer EL may further include at least one functional layer of a hole injection layer, a hole transporting layer, an electron injection layer, and an electron transporting layer. The functional layers may include an organic material.

The counter electrode PE2 may be disposed on the intermediate layer EL to cover the pixel defining layer PDL. The counter electrode PE2 may include a metal having a small work function. For example, the counter electrode PE2 may include at least one of lithium, calcium, aluminum, silver, and magnesium. Alternatively, the counter electrode PE2 may include the same material as the pixel electrode PE1. In embodiments, the pixel electrode PE1 may be an anode electrode, and the counter electrode PE2 may be a cathode electrode. In addition, in embodiments, the pixel electrode PE1 may be a cathode electrode, and the counter electrode PE2 may be an anode electrode.

Figure 16:
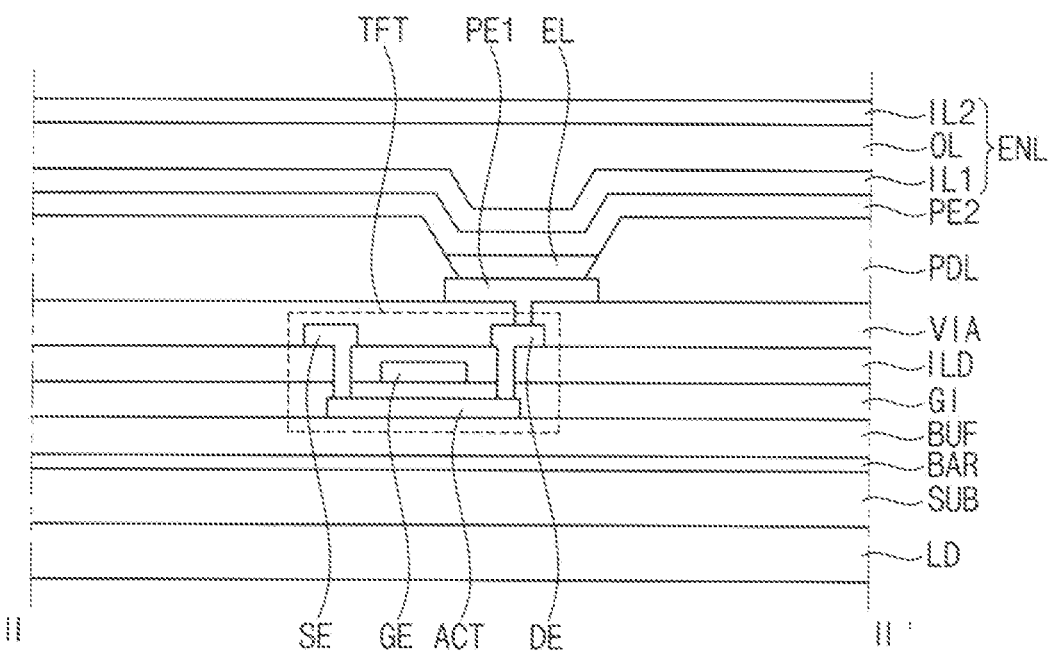
FIG. 16 is a cross-sectional view illustrating an embodiment taken along the line II-II' of FIG. 2.

FIG. 16 is a cross-sectional view illustrating an embodiment taken along the line II-II' of FIG. 2. FIG. 16 may be substantially the same as FIG. 15 except that a low refractive layer is added under the substrate. Accordingly, a description of the overlapping configuration will be omitted.

Figure 17:
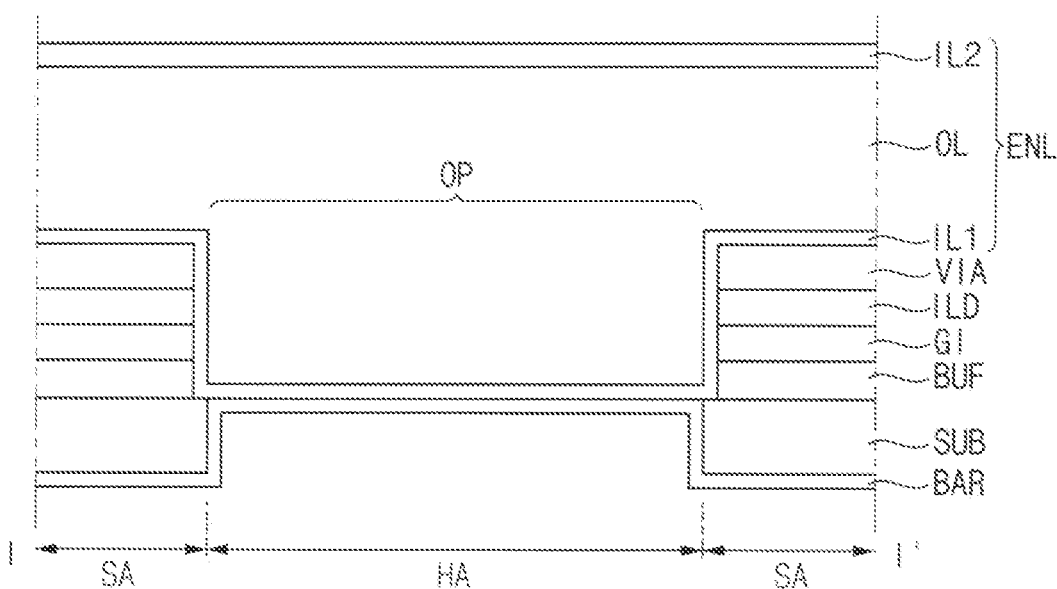
FIG. 17 is a cross-sectional view illustrating an embodiment taken along the line I-I' of FIG. 2.

FIG. 17 is a cross-sectional view illustrating an embodiment taken along the line I-I' of FIG. 2. FIG. 17 may be substantially the same as FIG. 12 except that the barrier layer is disposed under the substrate. Accordingly, a description of the overlapping configuration will be omitted.

Referring to FIG. 17, in the display device 10, the barrier layer BAR may be disposed under the substrate SUB. Accordingly, the barrier layer BAR may block moisture or the like penetrating into the substrate SUB.

In embodiments, the low refractive layer may be disposed under the barrier layer BAR. For example, the low refractive layer may be disposed to overlap the transmissive area HA of the barrier layer BAR and the light emitting area adjacent to the transmissive area HA. Alternatively, the low refractive layer may be disposed to overlap only the light emitting area of the barrier layer BAR.

Figure 18:
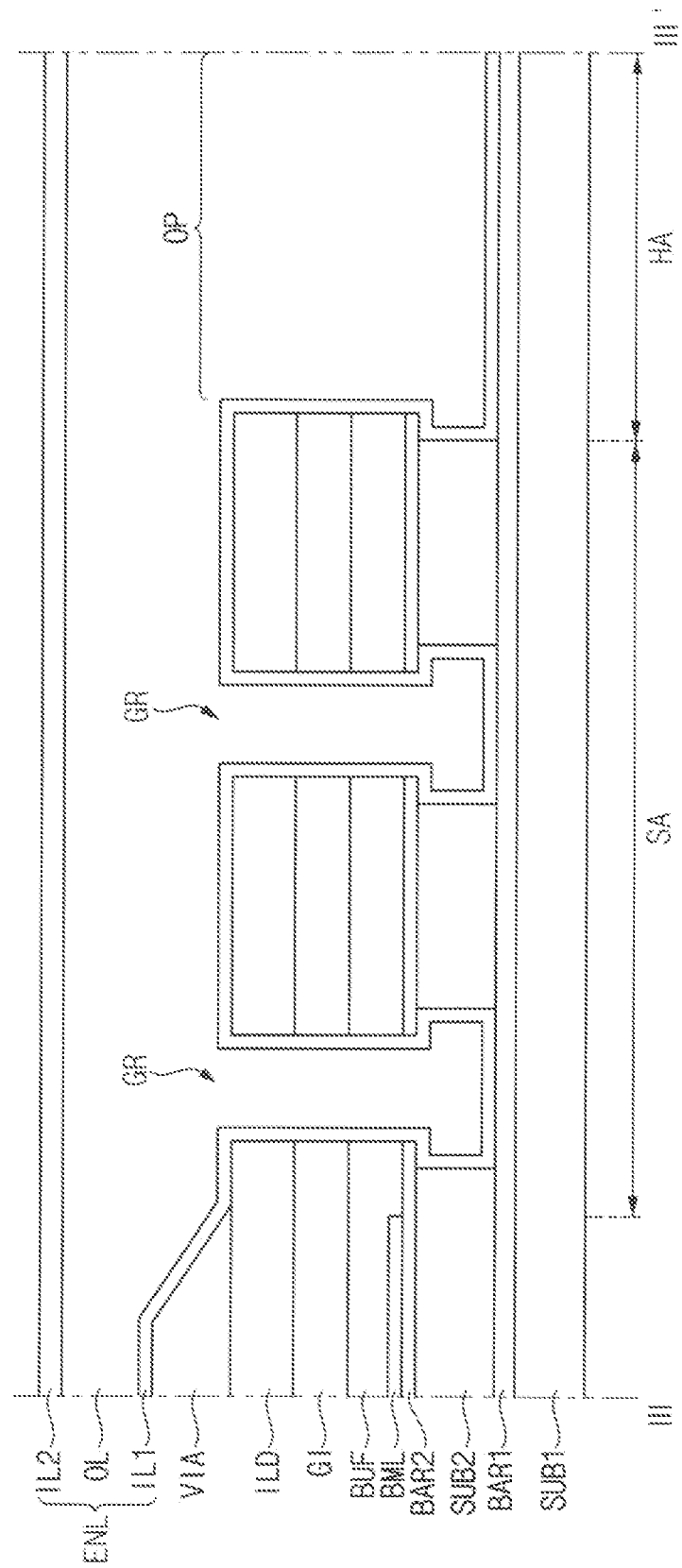
FIG. 18 is a cross-sectional view illustrating an embodiment taken along the line III-III' of FIG. 2.

FIG. 18 is a cross-sectional view illustrating an embodiment taken along the line III-III' of FIG. 2.

Referring to FIG. 18, the display device 10 may include at least one groove GR formed between the transmissive area HA and the light emitting area surrounding the transmissive area. The light emitting area may overlap an area in which the lower metal layer BML is disposed.

The groove GR may prevent moisture and oxygen penetrating through the transmission area HA from penetrating to the light emitting area. To this end, the groove GR may form a groove.

In embodiments, the groove GR may be formed by removing a portion of each of the second substrate SUB2, the second barrier layer BAR2, and the plurality of insulating layers disposed on the first barrier layer BAR1. In FIG. 18, the groove GR is formed by partially removing each of the second substrate SUB2, the second barrier layer BAR2, the buffer layer BUF, the gate insulating layer GI, and the interlayer insulating layer ILD.

In embodiments, when only the second substrate SUB2 and the second barrier layer BAR2 are disposed on the first barrier layer BAR1 in which the groove GR is formed, the groove GR may be formed by removing a portion of the second substrate SUB2 and the second barrier layer BAR2.

Figure 19:
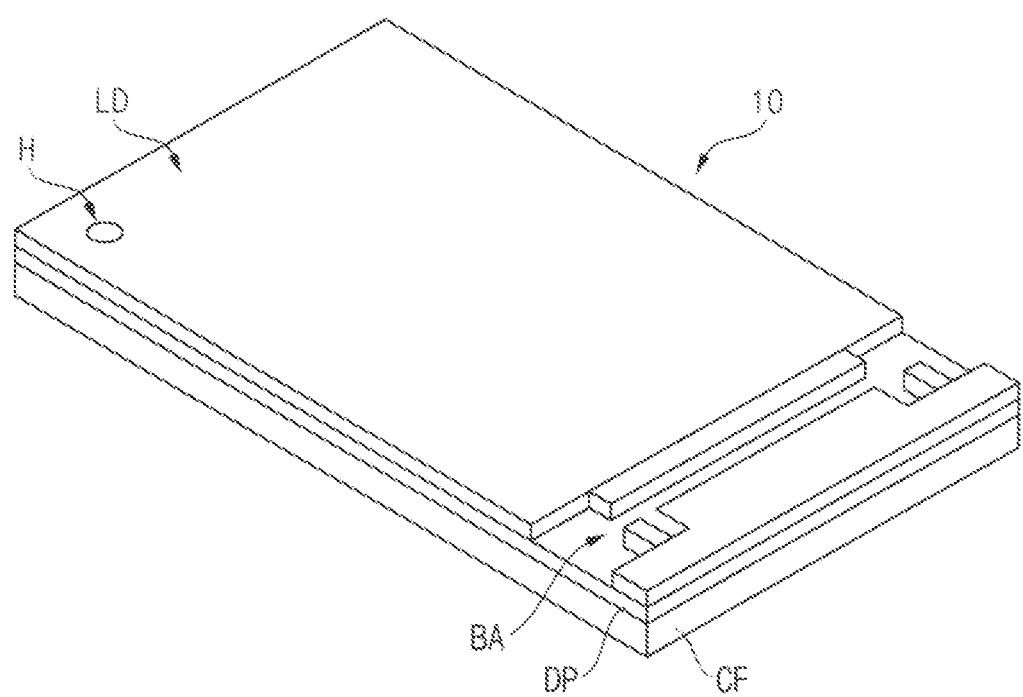
FIG. 19 illustrates an embodiment of a display device that includes a low refractive layer.

FIG. 19 is a diagram illustrating an embodiment of a low refractive layer included in the display device 10 of FIG. 1.

Referring to FIG. 19, the display device 10 may include a display panel DP, a low refractive layer LD, and a cover film CF. The cover film CF may be disposed on the upper surface of the display panel DP. That is, the cover film CF may be disposed on a surface where the display panel DP emits light to display an image. The low refractive layer LD may be generally disposed on a lower surface of the display panel DP. Thereafter, a bending area BA and a hole area H of the low refractive layer LD may be patterned. When the bending area BA is patterned, a radius of the bending area BA may be minimized when the display device 10 is bent based on the bending area BA. The hole region H may overlap the above-described transmission region HA. When the hole area H is patterned, the transmittance of the hole area H may be increased.

Alternatively, in embodiments, when the low refractive index layer LD is formed by an inkjet method, the material constituting the low refractive layer LD may be applied only to an area excluding the hole area H and the bending area BA. For example, resin or the like may be applied to a lower surface of the display panel DP as a low refractive layer LD.

Although the display devices in the embodiments have been described with reference to the drawings, the illustrated embodiments are examples, and may be modified and changed by a person having ordinary knowledge in the relevant technical field without departing from the scope of the appended claims.

What is claimed is:

1. A display device including a transmissive area and a light emitting area surrounding the transmissive area, the display device comprising:
   a first substrate;
   a barrier layer disposed on the first substrate and including an inorganic material;
   a second substrate disposed on the barrier layer and including an opening overlapping the transmissive area;
   a gate insulating layer disposed on the second substrate;

a light emitting element disposed on the second substrate and overlapping the light emitting area; and an encapsulation layer covering the light emitting element, contacting the barrier layer in the transmissive area, and including an inorganic encapsulation layer, the inorganic encapsulation layer including at least one selected from a group consisting of silicon oxide, silicon nitride, and silicon oxynitride, wherein the second substrate is disposed between the barrier layer and the gate insulating layer, wherein the barrier layer is disposed between the first substrate and the second substrate, and contacts the first substrate and the second substrate, and wherein the encapsulation layer covers the barrier layer across the transmissive area.

2. The display device of claim 1, wherein the encapsulation layer includes:
   a first inorganic encapsulation layer disposed on the second substrate and including an inorganic material;
   an organic encapsulation layer disposed on the first inorganic encapsulation layer, having a flat top surface, and including an organic material; and
   a second inorganic encapsulation layer disposed on the organic encapsulation layer and including an inorganic material.

3. The display device of claim 1, wherein the first substrate overlaps the light emitting area, and includes an opening that extends through the first substrate in the transmissive area.

4. The display device of claim 3, further comprising:
   a low refractive layer disposed under the first substrate, overlapping the light emitting area and the transmissive area, and having a refractive index lower than a refractive index of the first substrate,
   wherein the low refractive layer is a solid.

5. The display device of claim 4, wherein the low refractive layer is in contact with the barrier layer.

6. The display device of claim 3, further comprising:
   a low refractive layer disposed under the first substrate, overlapping the light emitting area, having a refractive index lower than a refractive index of the first substrate, and including an opening overlapping the transmissive area.

7. The display device of claim 1, further comprising:
   a low refractive layer disposed under the first substrate, and having a refractive index lower than a refractive index of the first substrate,
   wherein the low refractive layer is a solid.

8. The display device of claim 7, wherein the low refractive layer overlaps the light emitting area and the transmissive area.

9. The display device of claim 7, wherein the low refractive layer overlaps the light emitting area and the low refractive layer includes an opening overlapping the transmissive layer.

10. The display device of claim 1, wherein each of the first substrate and the second substrate includes polyimide.

11. The display device of claim 1, further comprising:
    a functional module disposed under the first substrate, and overlapping the transmissive area.

12. The display device of claim 11, wherein the functional module includes at least one of a camera module, a face recognition sensor module, a pupil recognition sensor module, an acceleration sensor module, a proximity sensor module, an infrared sensor module, an illuminance sensor module, and a light sensor module.

13. The display device of claim 1, wherein the barrier layer overlaps the light emitting area and the transmissive area.

14. The display device of claim 1, further comprising at least one groove formed between the transmissive area and the light emitting area.

15. A display device including a transmissive area and a light emitting area surrounding the transmissive area, the display device comprising:
    a substrate including an opening overlapping the transmissive area;
    a barrier layer disposed on the substrate, and including an inorganic material;
    a gate insulating layer disposed on the barrier layer;
    a light emitting element disposed on the barrier layer, and overlapping the light emitting area; and
    an encapsulation layer covering the light emitting element, being in direct contact with the barrier layer in the transmissive area, and including an inorganic encapsulation layer, the inorganic encapsulation layer including at least one selected from a group consisting of silicon oxide, silicon nitride, and silicon oxynitride,
    wherein the barrier layer is disposed between the substrate and the gate insulating layer, and contacts the substrate, and
    wherein the encapsulation layer covers the barrier layer across the transmissive area.

16. The display device of claim 15, wherein the encapsulation layer includes:
    a first inorganic encapsulation layer disposed on the barrier layer and including an inorganic material;
    an organic encapsulation layer disposed on the first inorganic encapsulation layer, having a flat top surface, and including an organic material; and
    a second inorganic encapsulation layer disposed on the organic encapsulation layer and including an inorganic material.

17. The display device of claim 15, further comprising at least one groove formed between the transmissive area and the light emitting area.

18. The display device of claim 15, wherein the barrier layer overlaps the transmissive area and the light emitting area.

19. The display device of claim 15, further comprising:
    a low refractive layer disposed under the substrate and having a refractive index lower than a refractive index of the substrate,
    wherein the low refractive layer is a solid.

20. The display device of claim 19, wherein the low refractive layer overlaps the light emitting area and the transmissive area.

21. The display device of claim 20, wherein the low refractive layer is in contact with the barrier layer.

22. The display device of claim 19, wherein the low refractive layer overlaps the light emitting area and the low refractive layer includes an opening overlapping the transmissive layer.

23. The display device of claim 15, wherein the substrate includes polyimide.

24. The display device of claim 15, further comprising:
    a functional module disposed under the first substrate, and overlapping the transmissive area.

25. The display device of claim 24, wherein the functional module includes at least one of a camera module, a face recognition sensor module, a pupil recognition sensor module, an acceleration sensor module, a proximity sensor module, an infrared sensor module, an illuminance sensor module, and a light sensor module.

\* \* \* \* \*